(12) United States Patent
Chen et al.

(10) Patent No.: US 8,902,561 B2
(45) Date of Patent: Dec. 2, 2014

(54) ELECTROSTATIC CHUCK WITH MULTI-ZONE CONTROL

(75) Inventors: Chia-Ho Chen, Zhubei (TW); Ming Huei Lien, New Taipei (TW); Shu-Fen Wu, Yilan (TW); Chih-Tsung Lee, Hsinchu (TW); You-Hua Chou, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 374 days.

(21) Appl. No.: 13/364,463

(22) Filed: Feb. 2, 2012

(65) Prior Publication Data
US 2013/0201596 A1 Aug. 8, 2013

(51) Int. Cl.
*H01L 21/683* (2006.01)

(52) U.S. Cl.
USPC .......................................... 361/234; 361/233

(58) Field of Classification Search
USPC ................................................. 361/234, 233
See application file for complete search history.

(56) References Cited

U.S. PATENT DOCUMENTS

| | | | |
|---|---|---|---|
| 6,215,641 B1 * | 4/2001 | Busse et al. | 361/234 |
| 6,721,162 B2 * | 4/2004 | Weldon et al. | 361/234 |
| 7,585,386 B2 * | 9/2009 | Okumura et al. | 156/345.51 |
| 7,922,862 B2 | 4/2011 | Okumura et al. | |
| 8,000,082 B2 * | 8/2011 | Dhindsa et al. | 361/234 |

FOREIGN PATENT DOCUMENTS

| | | |
|---|---|---|
| KR | 20010073565 A | 8/2001 |
| KR | 20020071168 A | 9/2002 |
| KR | 100839677 B1 | 6/2008 |

* cited by examiner

*Primary Examiner* — Zeev V Kitov
(74) *Attorney, Agent, or Firm* — Eschweiler & Associates, LLC

(57) ABSTRACT

An electrostatic chuck for clamping a warped workpiece has a clamping surface comprising a dielectric layer. The dielectric layer has a field and one or more zones formed of differing dielectric materials. One or more electrodes are coupled to a power supply, and a controller controls a clamping voltage supplied to the one or more electrodes via the power supply. An electrostatic attraction force associated with each of the field and one or more zones of the dielectric layer of the electrostatic chuck is induced, wherein the electrostatic attraction force varies based on the dielectric material of each of the field and one or more zones. The electrostatic attraction force is greater in the one or more zones than in the field, therein attracting warped regions of the workpiece to the clamping surface and clamping the warped workpiece to the clamping surface across a surface of the warped workpiece.

20 Claims, 3 Drawing Sheets

ELECTROSTATIC CHUCK WITH MULTI-ZONE CONTROL

BACKGROUND

In the manufacture of semiconductor devices, an electrostatic chuck (ESC) is often utilized to hold a workpiece, such as a silicon wafer, during processing thereof. In some system architectures, a robot is configured to transfer the workpiece to and from the electrostatic chuck in order to transfer the workpiece between various processing apparatuses.

Typically, the workpiece is attracted to a surface of the electrostatic chuck by an electrostatic attraction force developed between the workpiece and a dielectric layer of the ESC via an application of voltage applied to one or more electrodes residing below the dielectric layer.

Conventional electrostatic chucks, however, often have difficulty in properly attracting and clamping a workpiece to the surface of the electrostatic chuck when the workpiece has previously been warped due to previous processing thereof.

SUMMARY

The following presents a simplified summary in order to provide a basic understanding of one or more aspects of the disclosure. This summary is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

In one embodiment, the present disclosure relates to an electrostatic chuck having multiple zones, wherein an attractive force associated with a workpiece varies based on a dielectric material within the multiple zones.

The following description and annexed drawings set forth in detail certain illustrative aspects and implementations of the disclosure. These are indicative of but a few of the various ways in which the principles of the invention may be employed.

DETAILED DESCRIPTION

Figure 1:
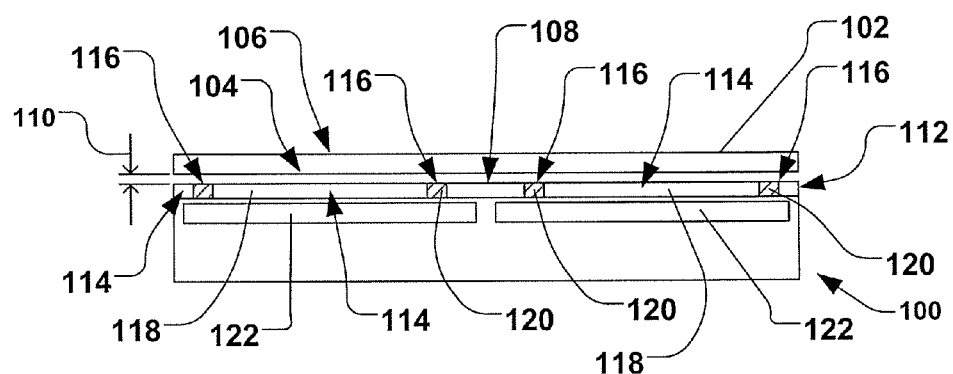
FIG. 1 illustrates a cross section of an electrostatic chuck according to one exemplary aspect of the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Referring now to the Figures, FIG. 1 illustrates one aspect of the disclosure, wherein an electrostatic chuck 100 for clamping a workpiece 102 is provided. In accordance with one example, the workpiece 102 is warped across a surface 104 thereof, wherein the warpage is a result of previous processing of the workpiece. For example, a thin layer (not shown) of material formed on a top surface 106 of the workpiece generally warps the workpiece 102 in a concave or convex manner.

The electrostatic chuck 100 of FIG. 1, for example, comprises a clamping surface 108 configured to contact the surface 104 of the workpiece 102. While not clearly evident in FIG. 1, a distance 110 between the surface 104 of the workpiece 102 and the clamping surface 108 varies across the workpiece due to the above-described warpage. As will be further discussed hereafter and as will be more prominently shown in future Figures, the present electrostatic chuck 100 is configured to generally clamp the workpiece 102 to the clamping surface 108, regardless of the initial variation in distance 110.

According to one example, the electrostatic chuck 100 comprises a dielectric layer 112, wherein the dielectric layer further comprises a field 114 and one or more zones 116 defined therein. The field 114, for example, is comprised of a first dielectric material 118, and the one or more zones 116 are comprised of a second dielectric material 120, wherein each of the first dielectric material and second dielectric material have different dielectric constants associated therewith.

One or more electrodes 122 are further associated with the dielectric layer 112, such as being disposed within or beneath the dielectric layer, wherein a voltage supplied to the one or more electrodes is configured to induce an electrostatic attraction force associated with each of the field 114 and the one or more zones 116. Accordingly, the electrostatic attraction force between the workpiece 102 and the clamping surface 108 of the electrostatic chuck 100 varies based on the composition of the dielectric material 118 and 120 of each of the respective field 114 and one or more zones 116. In accordance with one example, the electrostatic attraction force is greater in the one or more zones 116 than in the field 114.

Figure 2:
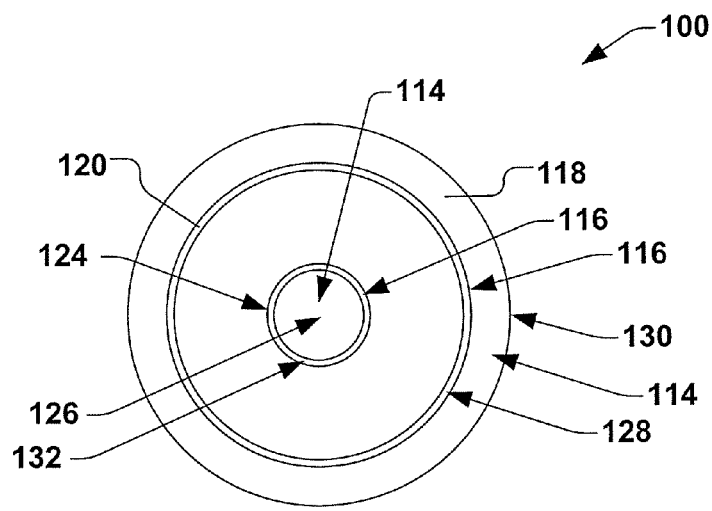
FIG. 2 illustrates a plan view of an electrostatic chuck according to another exemplary aspect of the disclosure.
Figure 3:
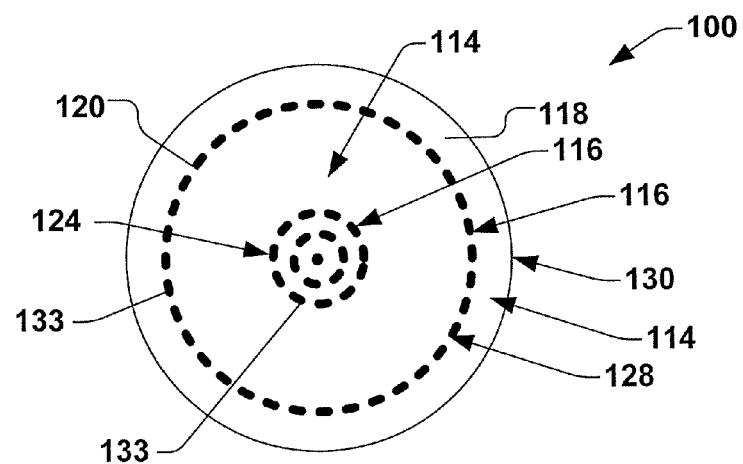
FIG. 3 illustrates a plan view of another exemplary electrostatic chuck according to still another aspect of the disclosure.

FIG. 2 illustrates a plan view of an exemplary electrostatic chuck 100, wherein the one or more zones 116 comprise one or more of a central zone 124 associated with a center 126 of the clamping surface and a peripheral zone 128 associated with a periphery 130 of the clamping surface. The central zone 124, for example, comprises one or more of a ring 132 and a disk (not shown) of the second dielectric material 120 that is generally surrounded by the field 114. Alternatively, one or more of the central zone 124 and peripheral zone 128 comprises a plurality of islands 133 or other pattern (not shown) of the second dielectric material 120, such as illustrated in FIG. 3. It will be understood that any pattern of the second dielectric material 120 is contemplated for the central zone 124 and peripheral zone 128.

Figure 4A:
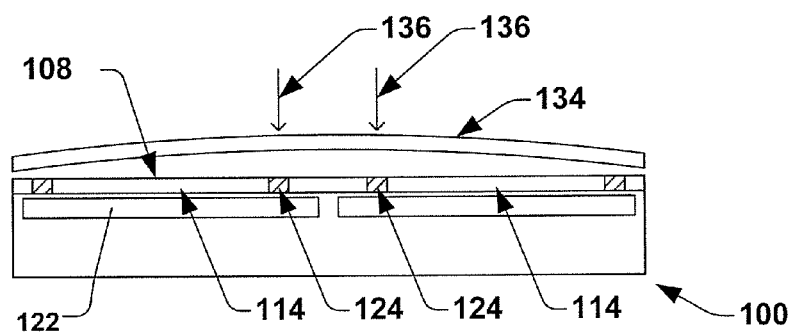
FIGS. 4A and 4B illustrate respective cross sectional views of exemplary warped workpieces on an electrostatic chuck according to yet another aspect of the disclosure.
Figure 4B:
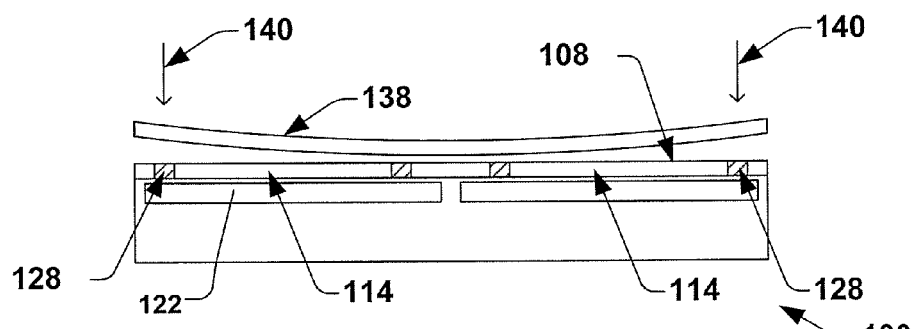

Accordingly, the electrostatic attraction force is greater in the central zone 124 and peripheral zone 128 than in the field 114, upon the application of the same clamping voltage to the one or more electrodes 122. For example, as illustrated in FIG. 4A, a convex-warped workpiece 134 is attracted to the clamping surface 108 by a greater clamping force (indicated by arrows 136) in the central zone 124 than in the rest of the field 114, thus attracting the entirety of the convex-warped workpiece toward the clamping surface. Likewise, as illustrated in FIG. 4B, a concave-warped workpiece 138 is attracted to the clamping surface 108 by a greater clamping force (indicated by arrows 140) in the peripheral zone 128 than in the rest of the field 114, thus attracting the entirety of the concave-warped workpiece toward the clamping surface.

Figure 5:
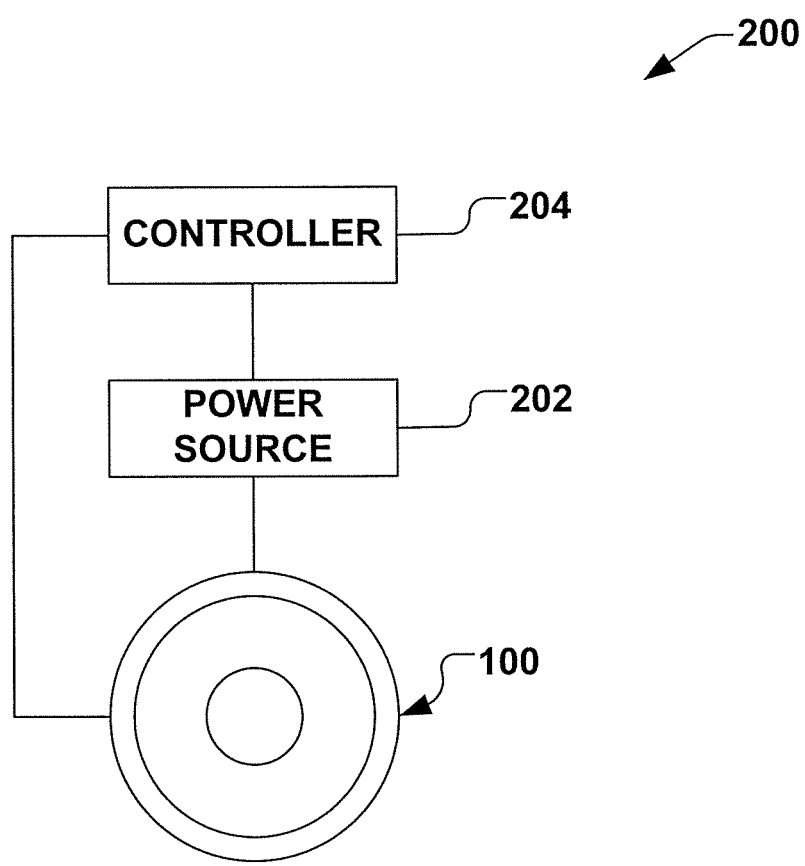
FIG. 5 illustrates a schematic of an electrostatic clamping system according to another exemplary aspect of the disclosure.

In accordance with another example, an electrostatic clamping system 200 is illustrated in FIG. 5, wherein the electrostatic clamping system is configured to clamp a warped workpiece, such as the convex-warped workpiece 134 and/or concave-warped workpiece 138 of FIGS. 3A and 3B. The electrostatic clamping system 200, for example, may comprise the electrostatic chuck 100 of FIGS. 1, 2, 3, and 4A-4B, or any other electrostatic chuck having varying dielectric properties across the surface thereof. The system 200 of FIG. 5, for example, further comprises a power supply 202, wherein, for example, the power supply is operably coupled to the one or more electrodes 122 of the electrostatic chuck 100 of FIG. 1. A controller 204, as illustrated in FIG. 5, is further configured to control a clamping voltage 206 supplied to the one or more electrodes 122 via a control of the power supply 202, therein inducing an electrostatic attraction force associated with each of the field 114 and one or more zones 116 of the dielectric layer 112 of the electrostatic chuck 100 described above. Thus, the electrostatic attraction force varies based on the dielectric material of each of the field 114 and one or more zones 116, wherein the electrostatic attraction force is greater in the one or more zones than in the field. Thus, warped regions of the warped workpiece (e.g., 134 and 138 of FIGS. 4A and 4B) are therefore attracted to the clamping surface 108 of the dielectric chuck 100 and are thus clamped to the clamping surface across the surface 104 of the warped workpiece. For example, a singular clamping voltage supplied by the power supply 202 provides a greater electrostatic attraction force to the warped workpiece in the one or more zones than in the field.

Thus, the present disclosure provides an electrostatic chuck comprising a clamping surface comprising a dielectric layer, wherein the dielectric layer further comprises a field and one or more zones defined therein. The field is comprised of a first dielectric material, and the one or more zones are comprised of a second dielectric material, wherein each of the first dielectric material and second dielectric material have different dielectric constants associated therewith. One or more electrodes are associated with the dielectric layer, such as being disposed below or within the dielectric layer, wherein a voltage supplied to the one or more electrodes is configured to induce an electrostatic attraction force associated with each of the field and one or more zone. The electrostatic attraction force accordingly varies across the surface of the electrostatic chuck, based on the dielectric material of each of the field and one or more zones.

Accordingly, in one example, the electrostatic attraction force is greater in the one or more zones than in the field. The one or more zones, for example, comprise a central zone associated with a center of the clamping surface and a peripheral zone associated with a periphery of the clamping surface. The central zone, for example, comprises a ring of the second dielectric material generally surrounded by the field. In another example, the peripheral zone comprises a ring of the second dielectric material generally surrounded by the field. In one alternative example, the central zone comprises a central disk of the second dielectric material. In another alternative example, one or more of the central zone and peripheral zone comprise a plurality of islands of the second dielectric material. An electrostatic attraction force is therefore greater, for example, in one or more of the central zone and peripheral zone than in the field, therein effectively providing a varying clamping force to a warped workpiece and generally clamping the workpiece to the clamping surface of the electrostatic chuck across the surface of the workpiece.

An electrostatic clamping system for clamping a warped workpiece is also provided, wherein the a power supply is operably coupled to the one or more electrodes of the electrostatic chuck. A controller is further configured to control a clamping voltage supplied to the one or more electrodes via a control of the power supply, therein inducing an electrostatic attraction force associated with each of the field and one or more zones of the dielectric layer of the electrostatic chuck. The electrostatic attraction force varies based on the dielectric material of each of the field and one or more zones, wherein the electrostatic attraction force is greater in the one or more zones than in the field. Thus, warped regions of the warped workpiece are attracted to the clamping surface of the dielectric layer at varying forces, therein clamping the warped workpiece to the clamping surface across a surface of the warped workpiece. In one example, a singular clamping voltage is supplied by the power supply to the one or more electrodes, therein providing a greater electrostatic attraction force to the warped workpiece in the one or more zones than in the field.

It will be appreciated that while reference is made throughout this document to exemplary structures in discussing aspects of methodologies described herein, those methodologies are not to be limited by the corresponding structures presented. Rather, the methodologies (and structures) are to be considered independent of one another and able to stand alone and be practiced without regard to any of the particular aspects depicted in the Figures. Additionally, layers described herein can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An electrostatic chuck, comprising:
   a clamping surface comprising a dielectric layer, wherein the dielectric layer comprises a field and a plurality of zones defined therein, wherein the plurality of zones comprise a central zone associated with a center of the clamping surface and a peripheral zone associated with a periphery of the clamping surface, wherein the field is comprised of a first dielectric material, and wherein the plurality of zones are comprised of a second dielectric material, wherein each of the first dielectric material and second dielectric material have different dielectric constants associated therewith, and wherein the central zone comprises a ring of the second dielectric material generally surrounded by the field; and one or more electrodes associated with the dielectric layer, wherein a voltage supplied to the one or more electrodes is configured to induce an electrostatic attraction force associated with each of the field and the plurality of zones, and wherein the electrostatic attraction force varies based on the dielectric material of each of the field and plurality of zones.

2. An electrostatic chuck, comprising:
a clamping surface comprising a dielectric layer, wherein the dielectric layer comprises a field and a plurality of zones defined therein, wherein the plurality of zones comprise a central zone associated with a center of the clamping surface and a peripheral zone associated with a periphery of the clamping surface, wherein the field is comprised of a first dielectric material, and wherein the plurality of zones are comprised of a second dielectric material, wherein each of the first dielectric material and second dielectric material have different dielectric constants associated therewith, and wherein the peripheral zone comprises a ring of the second dielectric material generally surrounded by the field; and
one or more electrodes associated with the dielectric layer, wherein a voltage supplied to the one or more electrodes is configured to induce an electrostatic attraction force associated with each of the field and plurality of zones, and wherein the electrostatic attraction force varies based on the dielectric material of each of the field and plurality of zones.

3. The electrostatic chuck of claim 1, wherein one or more of the central zone and peripheral zone further comprises a plurality of islands of the second dielectric material.

4. The electrostatic chuck of claim 1, wherein the electrostatic attraction force is greater in the central zone than in the field.

5. The electrostatic chuck of claim 1, wherein the electrostatic attraction force is greater in the peripheral zone than in the field.

6. The electrostatic chuck of claim 1, wherein the one or more electrodes are disposed below the dielectric layer.

7. The electrostatic chuck of claim 1, wherein the one or more electrodes are disposed within the dielectric layer.

8. An electrostatic clamping system for clamping a warped workpiece, the electrostatic clamping system comprising:
an electrostatic chuck comprising:
a clamping surface comprising a dielectric layer, wherein the dielectric layer comprises a field and plurality of zones defined therein, wherein the plurality of zones comprise a central zone associated with a center of the clamping surface and a peripheral zone associated with a periphery of the clamping surface, wherein the field is comprised of a first dielectric material, and wherein the plurality of zones are comprised of a second dielectric material, wherein each of the first dielectric material and second dielectric material have different dielectric constant associated therewith, and wherein the peripheral zone comprises a ring of the second dielectric material generally surrounded by the field; and
one or more electrodes associated with the dielectric layer;
a power supply operably coupled to the one or more electrodes; and
a controller, wherein the controller is configured to control a clamping voltage supplied to the one or more electrodes via the power supply, therein inducing an electrostatic attraction force associated with each of the field and plurality of zones of the dielectric layer of the electrostatic chuck, wherein the electrostatic attraction force varies based on the dielectric material of each of the field and one or more zones, wherein the electrostatic attraction force is greater in the plurality of zones than in the field, therein attracting warped regions of the warped workpiece to the clamping surface of the electrostatic chuck and clamping the warped workpiece to the clamping surface across a surface of the warped workpiece.

9. An electrostatic clamping system for clamping a warped workpiece, the electrostatic clamping system comprising:
an electrostatic chuck comprising:
a clamping surface comprising a dielectric layer, wherein the dielectric layer comprises a field and plurality of zones defined therein, wherein the plurality of zones comprise a central zone associated with a center of the clamping surface and a peripheral zone associated with a periphery of the clamping surface, wherein the field is comprised of a first dielectric material, and wherein the plurality of zones are comprised of a second dielectric material, wherein each of the first dielectric material and second dielectric material have different dielectric constant associated therewith, and wherein the central zone comprises a ring of the second dielectric material generally surrounded by the field; and
one or more electrodes associated with the dielectric layer;
a power supply operably coupled to the one or more electrodes; and
a controller, wherein the controller is configured to control a clamping voltage supplied to the one or more electrodes via the power supply, therein inducing an electrostatic attraction force associated with each of the field and plurality of zones of the dielectric layer of the electrostatic chuck, wherein the electrostatic attraction force varies based on the dielectric material of each of the field and plurality of zones, wherein the electrostatic attraction force is greater in the plurality zones than in the field, therein attracting warped regions of the warped workpiece to the clamping surface of the electrostatic chuck and clamping the warped workpiece to the clamping surface across a surface of the warped workpiece.

10. The electrostatic clamping system of claim 8, wherein a singular clamping voltage supplied by the power supply provides a greater electrostatic attraction force to the warped workpiece in the one or more zones than in the field.

11. The electrostatic clamping system of claim 8, wherein one or more of the central zone and peripheral zone further comprises a plurality of islands of the second dielectric material.

12. The electrostatic chuck of claim 1, wherein the peripheral zone comprises a ring of the second dielectric material generally surrounded by the field.

13. The electrostatic chuck of claim 2, wherein the plurality of the central zone and peripheral zone further comprises a plurality of islands of the second dielectric material.

14. The electrostatic chuck of claim 2, wherein the electrostatic attraction force is greater in the central zone than in the field.

15. The electrostatic chuck of claim 2, wherein the electrostatic attraction force is greater in the peripheral zone than in the field.

16. The electrostatic chuck of claim 2, wherein the one or more electrodes are disposed below the dielectric layer.

17. The electrostatic chuck of claim 2, wherein the one or more electrodes are disposed within the dielectric layer.

18. The electrostatic clamping system of claim 8, wherein the one or more electrodes are disposed within or below the dielectric layer.

19. The electrostatic clamping system of claim 9, wherein a singular clamping voltage supplied by the power supply provides a greater electrostatic attraction force to the warped workpiece in the plurality of zones than in the field.

20. The electrostatic clamping system of claim 9, wherein the plurality of the central zone and peripheral zone further comprises a plurality of islands of the second dielectric material.

* * * * *